United States Patent
Liu et al.

(10) Patent No.: US 8,912,134 B2
(45) Date of Patent: Dec. 16, 2014

(54) METHOD OF CLEANING COPPER MATERIAL SURFACES IN ULTRA LARGE SCALE INTEGRATED CIRCUITS AFTER POLISHING THE SAME

(71) Applicant: Hebei University of Technology, Tianjin (CN)

(72) Inventors: Yuling Liu, Tianjin (CN); Xiaoyan Liu, Tianjin (CN); Na Liu, Tianjin (CN); Yangang He, Tianjin (CN)

(73) Assignee: Hebei University of Technology, Tianjin (CN)

( * ) Notice: Subject to any disclaimer, the term of this patent is extended or adjusted under 35 U.S.C. 154(b) by 205 days.

(21) Appl. No.: 13/738,965

(22) Filed: Jan. 10, 2013

(65) Prior Publication Data

US 2013/0123158 A1    May 16, 2013

Related U.S. Application Data

(63) Continuation-in-part of application No. PCT/CN2010/080474, filed on Dec. 30, 2010.

(30) Foreign Application Priority Data

Jul. 21, 2010 (CN) .......................... 2010 1 0232260

(51) Int. Cl.
| | |
|---|---|
| *C11D 1/72* | (2006.01) |
| *B08B 3/08* | (2006.01) |
| *H01L 21/02* | (2006.01) |
| *C11D 3/00* | (2006.01) |
| *C11D 3/33* | (2006.01) |
| *C11D 11/00* | (2006.01) |

(52) U.S. Cl.
CPC .............. *C11D 1/72* (2013.01); *C11D 11/0047* (2013.01); *B08B 3/08* (2013.01); *H01L 21/02074* (2013.01); *C11D 3/0073* (2013.01); *C11D 3/33* (2013.01)
USPC .............................. 510/175; 510/176; 134/1.3

(58) Field of Classification Search
CPC ...... C11D 11/0047; C11D 3/0073; C11D 1/72
USPC ..................................... 510/175, 176; 134/1.3
See application file for complete search history.

(56) References Cited

U.S. PATENT DOCUMENTS

| 7,528,098 | B2 * | 5/2009 | Lee et al. ........................ 510/175 |
| 8,003,587 | B2 * | 8/2011 | Lee et al. ........................ 510/175 |
| 2001/0004633 | A1 * | 6/2001 | Naghshineh et al. .......... 510/175 |
| 2004/0112753 | A1 * | 6/2004 | Kesari et al. ..................... 205/87 |
| 2005/0090416 | A1 * | 4/2005 | Lee et al. ........................ 510/175 |
| 2005/0205835 | A1 * | 9/2005 | Tamboli et al. ............... 252/79.1 |
| 2007/0232512 | A1 * | 10/2007 | Nishiwaki ...................... 510/175 |
| 2009/0203566 | A1 * | 8/2009 | Lee et al. ........................ 510/175 |
| 2010/0273330 | A1 * | 10/2010 | Farkas et al. ................... 438/692 |

* cited by examiner

*Primary Examiner* — Gregory Webb
(74) *Attorney, Agent, or Firm* — Matthias Scholl P.C.; Matthias Scholl

(57) ABSTRACT

A method of cleaning copper material surfaces in ultra large scale integrated circuits after polishing, the method including: a) mixing and stirring between 1 and 4 wt. % of a surfactant, between 0.5 and 3 wt. % of a chelating agent, between 0.1 and 5 wt. % of a corrosion inhibitor, and deionized water, to yield a water soluble cleaning solution with pH value of between 7.4 and 8.2; and b) washing the copper material surfaces using the cleaning solution after alkaline chemical-mechanical polishing under following conditions: between 2000 and 3000 Pa of pressure; between 1000 and 5000 mL/min of flow rate; and at least between 0.5 and 2 min of washing time.

4 Claims, No Drawings

METHOD OF CLEANING COPPER MATERIAL SURFACES IN ULTRA LARGE SCALE INTEGRATED CIRCUITS AFTER POLISHING THE SAME

CROSS-REFERENCE TO RELATED APPLICATIONS

This application is a continuation-in-part of International Patent Application No. PCT/CN2010/080474 with an international filing date of Dec. 30, 2010, designating the United States, now pending, and further claims priority benefits to Chinese Patent Application No. 201010232260.3 filed Jul. 21, 2010. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 14781 Memorial Drive, Suite 1319, Houston, Tex. 77079.

BACKGROUND OF THE INVENTION

1. Field of the Invention

The invention relates to a method of cleaning semi-conductor materials, and more particularly to a method of cleaning copper material surfaces in ultra large scale integrated circuits (hereinbelow refer to as ULSI) after polishing the surfaces.

2. Descriptions of the Related Art

The increase in the density of integrated circuits and the decrease in the size of elements thereof make the capacity between wires and the resistance of metal interconnects enlarge, which results in longer resistance and capacitance delay (RC delay). Copper has a low resistivity and thermal sensitivity, and superb anti-electromigration; in addition, it produces a shorter RC delay and improves the reliability of circuits. Thus, copper wire is an ideal substitute for aluminum wire to work as interconnection lines.

Chemical-mechanical polishing (hereinbelow refer to as CMP) for copper in ULSI has been one of the focused core technologies of the world. Currently, when the polishing process of the CMP method is accomplished, molecular bonds of surface atoms of copper are just broken, so that the surface has a high energy which can easily adsorb small grains to lower the surface energy. Therefore, grains of abrasive in the polishing solution are very easy to be adsorbed on copper surface; residues of polishing solution surrounding grains have large surface tension, and are distributed as globules on copper surface, which easily results in uneven corrosion, bad surface uniformity, increase in the later cleaning cost, and decrease in product yields.

SUMMARY OF THE INVENTION

In view of the above-described problems, it is one objective of the invention to provide a method of cleaning copper material surfaces in ULSI after polishing which has an easy operation, pollution free, and cleanness.

To achieve the above objective, in accordance with one embodiment of the invention, there is provided a method of cleaning copper material surfaces in ULSI after polishing, the method comprising:

a) mixing and stirring between 1 and 4 wt. % of a surfactant, between 0.5 and 3 wt. % of a chelating agent, between 0.1 and 5 wt. % of a corrosion inhibitor, and deionized water, to yield a water soluble cleaning solution with pH value of between 7.4 and 8.2, the wt. % being based on the total weight of the cleaning solution; and b) washing the copper material surface using the prepared cleaning solution after alkaline CMP under following conditions:
pressure: between 2000 and 3000 Pa;
flow rate: between 1000 and 5000 mL/min; and
washing time: at least between 0.5 and 2 min.

In a class of this embodiment, the surfactant is an FA/O I surfactant, $O_\pi$-7 (($C_{10}H_{21}$—$C_6H_4$—O—$CH_2CH_2O)_7$—H), $O_\pi$-10 (($C_{10}H_{21}$—$C_6H_4$—O—$CH_2CH_2O)_{10}$—H), O-20 ($C_{12\text{-}18}H_{25\text{-}37}$—$C_6H_4$—O—$CH_2CH_2O)_{70}$—H), or polyoxyethylene secondary alkyl alcohol ether (JFC).

In a class of this embodiment, the chelating agent is an FA/O II chelating, and in particular, tetra(THEED)-EDTA, i.e., the tetra(N,N,N',N'-tetrakis(2-hydroxyethyl)ethylenediamine) salt of ethylenediaminetetraacetic acid, the structural formula of which is as follows:

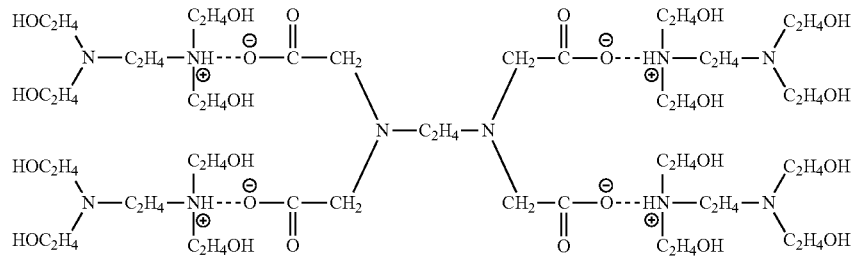

In a class of this embodiment, the corrosion inhibitor is an FA/O II corrosion inhibitor supplied by Tianjin Jingling Microelectronics Materials Co., Ltd. The FA/O II corrosion inhibitor is a complex of urotropine (hexamethylenetetramine) and benzotriazole (1,2,3-triaza-1h-indene), the molecular formula of urotropine is $C_6H_{12}N_4$, and the structural formula thereof is

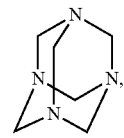

the molecular formula of benzotriazole is $C_6H_5N_3$, and the structural formula thereof is

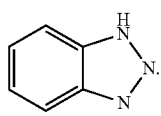

Advantages of the invention are summarized below:

after CMP, washing is quickly processed using the cleaning solution at a large flow rate to wash away unevenly distributed cleaning solution residues, thereby obtaining a clean and perfect surface. The surfactant quickly lowers the high surface tension of surface after polishing, reduces damaged layers, and improves the evenness of the surface. The chelating agent reacts with residues of metal ions to yield macromolecular chelates, which are washed away from the surface at large flow rate of the cleaning solution. The corrosion inhibitor forms a single molecular passive film on the surface to prevent polishing solution residues from continuing reacting with the surface, so that the perfection of the wafer surface is improved.

In the method of the invention, washing is quickly processed using the cleaning solution at a large flow rate after CMP, which effectively solves problems in prior art:

1) washing with cleaning solution under conditions of low pressure, large flow rate, and no time delay, not only can effectively optimize and lower the roughness of copper surface, but also can quickly wash away abrasive grains adsorbed on copper surface;
2) nonionic surfactant in the cleaning solution effectively lowers the surface tension of polishing solution residues, and at the same time prior be absorbed on copper surface to form a single molecular film which protects copper materials and avoids uneven corrosion circles on copper surface surrounding abrasive grains; and
3) cleaning solution quickly washes away polishing solution residues, thereby obtaining a clean and perfect surface.

In summary, the method has an easy operation, low cost, high efficiency, pollution free, and no additional device, prominently improves the performance of devices, and improves product yields.

DETAILED DESCRIPTION OF THE EMBODIMENTS

To further illustrate the invention, experiments detailing a method of cleaning copper material surfaces in ULSI after polishing are described below. It should be noted that the following examples are intended to describe and not to limit the invention.

Example 1

To 1912 g of 18 MΩ ultrapure deionized water, 20 g of a surfactant, 60 g of a chelating agent, and 8 g of a corrosion inhibitor were added and stirred. Subsequently, 2000 g of a cleaning solution with pH value of between 7.4 and 8.2 was collected. After alkaline CMP, copper materials were washed with the prepared cleaning solution under 3000 Pa of a low pressure and 5000 mL/min of a flow rate for 2 min, to make the surface smooth. The unevenness of the surface is 0.07, and the roughness of the surface is 0.5 nm.

The corrosion inhibitor is an FA/O II corrosion inhibitor; the chelating agent is an FA/O II chelating agent; the surfactant is an FA/O I surfactant, $O_\pi$-7 (($C_{10}H_{21}$—$C_6H_4$—O—$CH_2CH_2O)_7$—H), $O_\pi$-10 (($C_{10}H_{21}$—$C_6H_4$—O—$CH_2CH_2O)_{10}$—H), O-20 ($C_{12-18}H_{25-37}$—$C_6H_4$—O—$CH_2CH_2O)_{70}$—H), or (JFC). The FA/O I surfactant, the FA/O II chelating agent, and the FA/O II corrosion inhibitor all are supplied by Tianjin Jingling Microelectronics Materials Co., Ltd.

Example 2

To 2745 g of 18 MΩ ultrapure deionized water, 110 g of a surfactant, 15 g of a chelating agent, and 130 g of a corrosion inhibitor were added and stirred. Subsequently, 3000 g of a cleaning solution with pH value of between 7.4 and 8.2 was collected. After alkaline CMP, copper materials were washed with the prepared cleaning solution under 2000 Pa of a low pressure and 1000 mL/min of a flow rate for 1 min, to make the surface smooth. The unevenness of the surface is 0.04, and the roughness of the surface is 0.2 nm.

Selections of the surfactant, chelating agent, and corrosion inhibitor all are same as those of Example 1.

Example 3

To 3320 g of 18 MΩ ultrapure deionized water, 90 g of a surfactant, 35 g of a chelating agent, and 115 g of a corrosion inhibitor were added and stirred. Subsequently, 3560 g of a cleaning solution with pH value of between 7.4 and 8.2 was collected. After alkaline CMP, copper materials were washed with the prepared cleaning solution under 2500 Pa of a low pressure and 3000 mL/min of a flow rate for 1 min, to make the surface smooth. The unevenness of the surface is 0.05, and the roughness of the surface is 0.3 nm.

Selections of the surfactant, chelating agent, and corrosion inhibitor all are same as those of Example 1.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method of cleaning copper material surfaces in ultra large scale integrated circuits after polishing, comprising:
    a) mixing and stirring between 1 and 4 wt. % of a surfactant, between 0.5 and 3 wt. % of a chelating agent, between 0.1 and 5 wt. % of a corrosion inhibitor, and deionized water, to yield a water soluble cleaning solution with pH value of between 7.4 and 8.2, the wt. % being expressed based on the total weight of the cleaning solution; and
    b) washing the copper material surfaces using the cleaning solution after alkaline chemical-mechanical polishing under following conditions:
    pressure: between 2000 and 3000 Pa;
    flow rate: between 1000 and 5000 mL/min; and
    washing time: at least between 0.5 and 2 min.

2. The method of claim 1, wherein the surfactant is an FA/O I surfactant, $O_\pi$-7 (($C_{10}H_{21}$—$C_6H_4$—O—$CH_2CH_2O)_7$—H), $O_{90}$-10 (($C_{10}H_{21}$—$C_6H_4$—O—$CH_2CH_2O)_{10}$—H), O-20 ($C_{12-18}H_{25-37}$—$C_6H_4$—O—$CH_2CH_2O)_{70}$—H), or polyoxyethylene secondary alkyl alcohol ether (JFC).

3. The method of claim 1, wherein the chelating agent is an FA/O II chelating agent: ethylene diamine tetra-acetic acid tetra(tetra-hydroxyethyl ethylene diamine).

4. The method of claim 1, wherein the corrosion inhibitor is an FA/O II corrosion inhibitor.

* * * * *